US009070466B2

(12) United States Patent
Jefremow et al.

(10) Patent No.: US 9,070,466 B2

(45) Date of Patent: Jun. 30, 2015

(54) MISMATCH ERROR REDUCTION METHOD AND SYSTEM FOR STT MRAM

(75) Inventors: Mihail Jefremow, Augsburg (DE); Wolf Allers, Munich (DE); Jan Otterstedt, Unterhaching (DE); Christian Peters, Vaterstetten (DE); Thomas Kern, Munich (DE)

(73) Assignee: Infineon Technologies AG, Neubiberg (DE)

( * ) Notice: Subject to any disclaimer, the term of this patent is extended or adjusted under 35 U.S.C. 154(b) by 368 days.

(21) Appl. No.: 13/605,693

(22) Filed: Sep. 6, 2012

(65) Prior Publication Data

US 2014/0063923 A1 Mar. 6, 2014

(51) Int. Cl.
*G11C 11/16* (2006.01)

(52) U.S. Cl.
CPC .................................. *G11C 11/1673* (2013.01)
USPC ....................... 365/189.09; 365/158; 365/203

(58) Field of Classification Search
CPC ...... G11C 11/14; G11C 11/1673; G11C 7/06; G11C 11/16
USPC ........................ 365/189.07, 189.09, 158, 203
See application file for complete search history.

(56) References Cited

U.S. PATENT DOCUMENTS

| | | | | |
|---|---|---|---|---|
| 4,907,201 | A * | 3/1990 | Minami et al. | 365/207 |
| 5,049,758 | A * | 9/1991 | Mead et al. | 365/185.21 |
| 6,194,956 | B1 | 2/2001 | Barnes | |
| 7,443,234 | B2 * | 10/2008 | Iriguchi | 330/9 |
| 8,570,095 | B1 * | 10/2013 | Ryat | 327/530 |
| 2003/0103395 | A1 | 6/2003 | Ooishi | |
| 2004/0062074 | A1 | 4/2004 | Ooishi | |
| 2006/0152262 | A1 * | 7/2006 | Park | 327/172 |
| 2007/0085608 | A1 | 4/2007 | Iriguchi et al. | |
| 2007/0200622 | A1 | 8/2007 | Filoramo et al. | |
| 2012/0294090 | A1 | 11/2012 | Chang et al. | |
| 2013/0265820 | A1 * | 10/2013 | Chih et al. | 365/158 |
| 2014/0063923 | A1 | 3/2014 | Jefremow et al. | |
| 2014/0153313 | A1 * | 6/2014 | Boujamaa et al. | 365/148 |

OTHER PUBLICATIONS

U.S. Appl. No. 13/689,869, filed Nov. 30, 2012.
Jisu Kim, et al.; "A Novel Sensing Circuit for Deep Submicron Spin Transfer Torque MRAM (STT-MRAM)"; IEEE Transactions on Very Large Scale Integration (VLSI) Systems, 2010, p. 1-5.
Christian C. Enz, et al.; "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, p. 1584-1614.

(Continued)

*Primary Examiner* — Douglas King

(74) *Attorney, Agent, or Firm* — Eschweiler & Associates, LLC

(57) ABSTRACT

The invention relates to methods and systems for reading a memory cell and in particular, an STT MRAM. In accordance with one aspect of the invention, a method for reading a memory cell includes combining a cell current from a memory cell with a reference current from a reference source to create an average current, enabling the average current to flow through a first mirror transistor in a sense path and a second mirror transistor in a reference path, storing the current mismatch on a capacitor coupled to the gates of the first mirror transistor and the second mirror transistor, disconnecting the memory cell from the reference path and disconnecting the reference source from the sense path, enabling the cell current only to flow through the sense path, and determining the output level of the memory cell.

33 Claims, 4 Drawing Sheets

100
138 sense path
136 reference path
$V_1$ 104 P1
122 ΔV
106 $V_2$ P2
128 cell out
120
130 ref out
126
BL control
108 118 110
134, cell current
102
124
132, reference current

(56) References Cited

OTHER PUBLICATIONS

T. M. Maffitt, et al.; "Design Considerations for MRAM", IBM J. RES. & DEV., vol. 50, No. 1, Jan. 2006, p. 25-39.
M. Hosomi, et al.; "A Novel Nonvolatile Memory with Spin Torque Transfer Magnetization Switching: Spin-RAM", 2005 IEEE, p. 1-4.
El Mehdi Boujamaa, "Low Offset, High Gain Sense Amplifier for Resistive Memories Featuring a Time Multiplexed Reference", Intel Mobile Communications—Sophia Antipolis—France, Jun. 19, 2012, p. 1-12.
T. Kawahara; "Non-Volatile Memory and Normally-Off Computing", ASP-DAC 2011, Jan. 26, 2011, Yokohama, Japan, p. 1-53.
Non-Final Office Action dated Jan. 16, 2015 for U.S. Appl. No. 13/689,869.

* cited by examiner

10
~Iref
Iref
14
16
34
32
cell out
30
ref out
32
BL control
voltage
28
18
20
38
26
36
12
22
24
reference
current
cell
current 100
138
sense path
136
reference path
122
V1
104
106
V2
P1
P2
ΔV
128
cell out
120
130
ref out
126
BL control
108
110
118
134, cell
current
102
124
132, reference
current 100
138
sense path
136
reference path
Vref2-ΔV
=Vref1
122
Vref2
202
104
106
Iref
P1
P2
Iref
ΔV
128
cell out
130
126
ref out
BL control
108
110
118
134, cell
current
132, reference
current
102
124

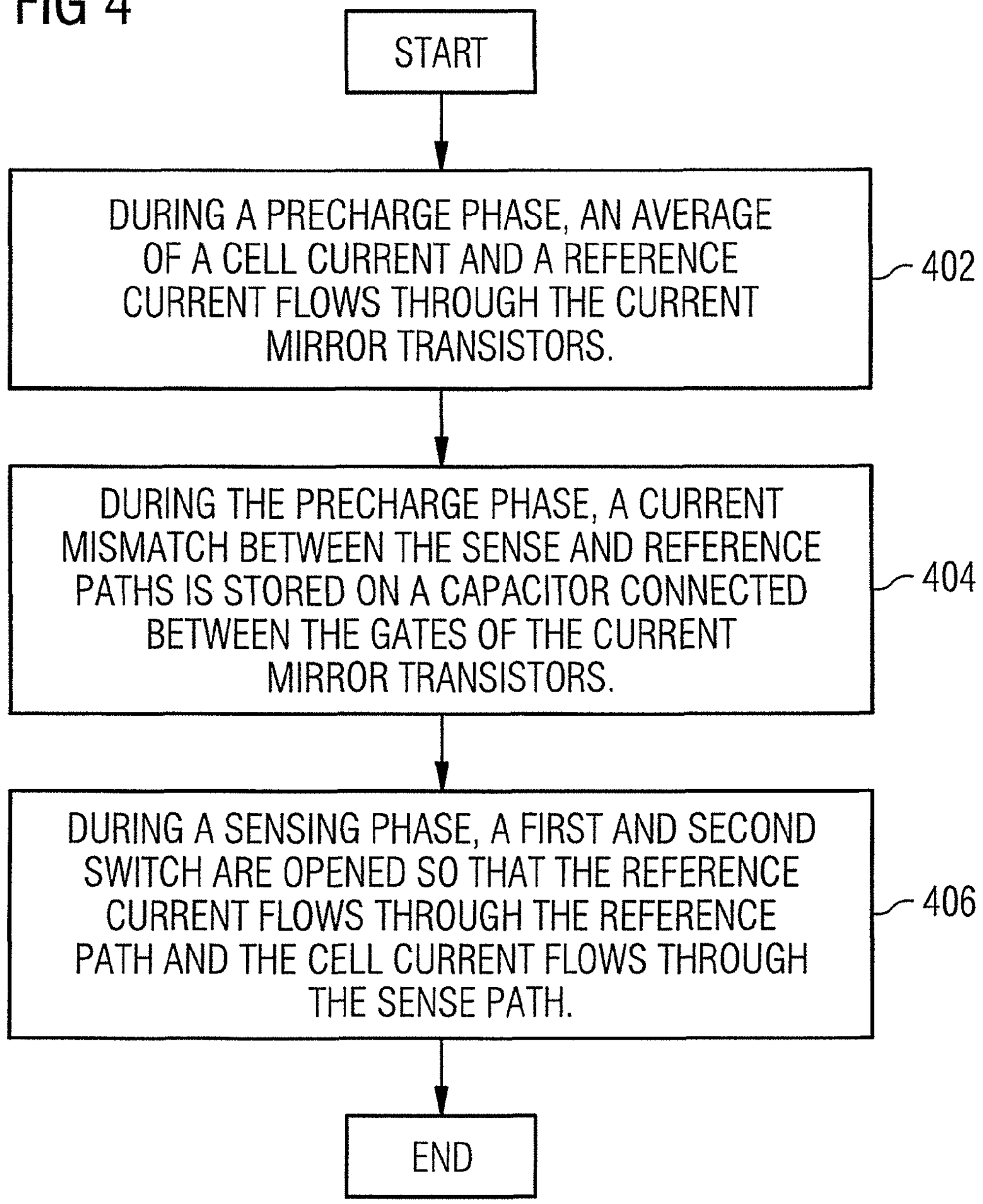
FIG 4
START
DURING A PRECHARGE PHASE, AN AVERAGE OF A CELL CURRENT AND A REFERENCE CURRENT FLOWS THROUGH THE CURRENT MIRROR TRANSISTORS.
402
DURING THE PRECHARGE PHASE, A CURRENT MISMATCH BETWEEN THE SENSE AND REFERENCE PATHS IS STORED ON A CAPACITOR CONNECTED BETWEEN THE GATES OF THE CURRENT MIRROR TRANSISTORS.
404
DURING A SENSING PHASE, A FIRST AND SECOND SWITCH ARE OPENED SO THAT THE REFERENCE CURRENT FLOWS THROUGH THE REFERENCE PATH AND THE CELL CURRENT FLOWS THROUGH THE SENSE PATH.
406
END

MISMATCH ERROR REDUCTION METHOD AND SYSTEM FOR STT MRAM

FIELD

The invention relates to methods and systems for sense amplifiers for memory cells. More specifically, the invention relates to methods and systems for reducing mismatch error for sense amplifiers for memory cells, and in particular for sense amplifiers for Spin Torque Transfer Magnetic Random Access Memory (STT MRAM) cells.

BACKGROUND

Magnetoresistive random access memory (MRAM) is a non-volatile random access memory in which data is stored by magnetic storage elements.

A conventional MRAM cell comprises two ferromagnetic plates separated by a thin insulating layer. One of the two plates is a permanent magnet ("fixed layer") set to a particular polarity while the field of the second plate ("free layer") can be configured to match that of an external field to store data. This configuration is known as a spin valve and is the simplest structure for an MRAM bit. Such magnetic memory cells may be combined to form a memory device.

Sensing or reading a magnetic memory cell is accomplished by measuring the electrical resistance of the cell. A particular cell is typically selected by powering an associated transistor that switches current from a bitline through the cell to ground. The electrical resistance of the cell changes due to the spin orientation of the electrons in the two plates of the STT MRAM cell. By measuring the resulting current, the resistance inside any particular cell can be determined. In general, the cell is considered to be a "1" if the two plates have the same polarity and a "0" if the two plates are of opposite polarity and have a higher resistance.

FIG. 1 is a schematic diagram of a conventional system 10 for sensing a magnetic memory cell 12 such as a Spin Transfer Torque Magnetoresistive Random Access Memory (STT MRAM) cell. The prior art system 10 comprises a plurality of transistors, 14, 16, 18 and 20, a reference current source 22 for providing a reference current 24, a cell current 26 from the memory cell 12, a bitline (BL) control voltage 28, a cell output node 30, a reference output node 32 and a mirrored reference current 34. The transistors 14 and 16 may be PMOS transistors, while the remaining transistors 18 and 20 may be NMOS transistors.

In operation, the two pairs of transistors of the prior art sensing system 10 adjust and sense the cell current 26 and the reference current 24 and convert the current difference into a voltage difference between the output nodes 30 and 32. The first pair of transistors 14 and 16 acts as a current mirror while transistors 18 and 20 act as clamp devices for bitline voltage regulation, which may be adjusted by BL control voltage 28. After the BL control voltage 28 is set, transistors 18 and 20 charge the reference bitline 36 and the cell bitline 38 to a fixed potential which is typically about one threshold voltage of NMOS transistor below BL control voltage 28. The PMOS transistor 16, which is part of the current mirror, senses the reference current 24 which flows through the NMOS transistor 20. The reference current source 22 is conventionally implemented by an NMOS transistor with accurately controlled gate voltage or by so called reference cells such as preconditioned STT MRAM cells. The reference current 24 is usually set between the current which corresponds to a high current STT MRAM cell state and the current corresponding to a low current STT MRAM cell state. This reference current 24 is mirrored simultaneously by the PMOS current mirror 14, 16 to the cell out node 30. The cell current 26 flows through the NMOS transistor 18 to the cell out node 30. If the cell current 26 is higher than the reference current 24, then the cell out voltage 30 is driven to ground. If the cell current 26 is lower than the reference current 24, then the cell out voltage 30 goes up to VDD. The voltage at the reference out node 32 remains fixed at about one threshold voltage of the PMOS transistor 16 below VDD due to the diode connected PMOS 16. The voltage difference between the cell out node 30 and the reference out node 32 is compared and amplified by a subsequent differential latch circuit (not shown) to a full CMOS level.

Two of the main problems with the prior art sensing system 10 are the accuracy of the mirrored reference current, Iref mir 34, and the difference between the bitline voltage 38 and the reference bitline voltage 36 if the difference of the cell currents between a high current cell state and low current cell state of the STT MRAM cell, also known as the read window, is small. These two effects diminish the accuracy of the sense amplifier by resulting in two limiting factors for the read window: the current mirror in the sense amplifier and the devices controlling the bit line voltage which are necessary for the STT MRAM memory cell.

The mismatch of the threshold voltages Vtp of the PMOS transistors 14, 16 in the current mirror leads to a mismatch of the mirrored reference current Iref mir 34 and the reference current Iref 24. The mismatch of the threshold voltages Vtn of the NMOS transistors 18, 20 results in different voltages across the selected STT-MRAM cell 12 and the reference current source 22, which may also be a preconditioned STT-MRAM cell. This voltage difference leads to a current difference between the reference current 24 and the cell current 26 for the same resistances for both paths since the current of an STT MRAM cell is directly proportional to a voltage across it.

Therefore, there exists a need for a system and method for sensing a magnetic memory cell, such as an STT MRAM, that reduces the mismatch of the current in the sense and reference paths and improves the accuracy of the sensing system with minimal impact on the overall speed.

SUMMARY

In accordance with one aspect of the invention, a system for sensing or reading a memory cell, such as an STT MRAM, comprises a first and second mirror transistor, and a capacitor coupled to the gates of the first and second mirror transistors for storing a current mismatch between the first and second mirror transistors. The system further comprises a reference source for providing a reference current, wherein the reference current and a cell current from the memory cell are combined to provide an average current that flows through the first and second mirror transistors. In one embodiment, the averaging of the cell current and the reference current is done during a precharge phase so that an equal averaged current flows through the first and second mirror transistors during the precharge phase. During a subsequent sensing phase, only the cell current flows through the first mirror transistor and only the reference current flows through the second mirror transistor. The current through the first mirror transistor is now independent of the current mismatch.

In accordance with a further aspect of the invention, a method for reading or sensing a memory cell, such as an STT MRAM comprises averaging a cell current and a reference current during a precharge phase, enabling the averaged current to flow through a first mirror transistor and a second mirror transistor, and storing a current mismatch on a capacitor between the gates of the first and second mirror transistors. The method further comprises enabling the cell current only to flow through the first mirror transistor during a sensing phase, enabling the reference current only to flow through the second mirror transistor during the sensing phase, and converting the current difference between the cell current and the reference current into a voltage difference.

In another embodiment, a method for sensing a memory cell comprises the steps of providing a sense path and a reference path for a memory cell and an associated reference source, and combining a cell current from the memory cell and a reference current from the reference source to create an average current that flows through a first and second mirror transistor. The method further comprises disconnecting the memory cell from the reference path and disconnecting the reference source from the sense path, and providing the cell current from the memory cell through the sense path.

Further features, aspects and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

FIG. 4 is a flowchart showing a method for sensing a magnetic memory cell in accordance with one embodiment of the present invention.

DETAILED DESCRIPTION

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. Therefore, the following detailed description is not to be taken in a limiting sense, and the scope of the present invention is defined by the appended claims.

Figure 1:
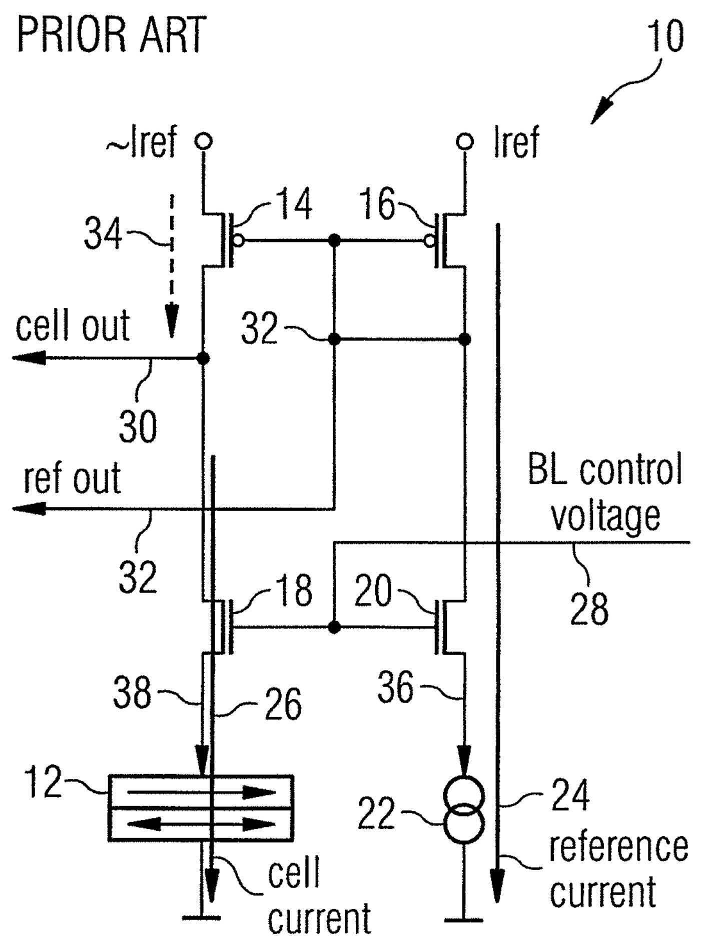
FIG. 1 is a schematic diagram of a conventional embodiment of a magnetic memory cell and a sense amplifier.
Figure 2:
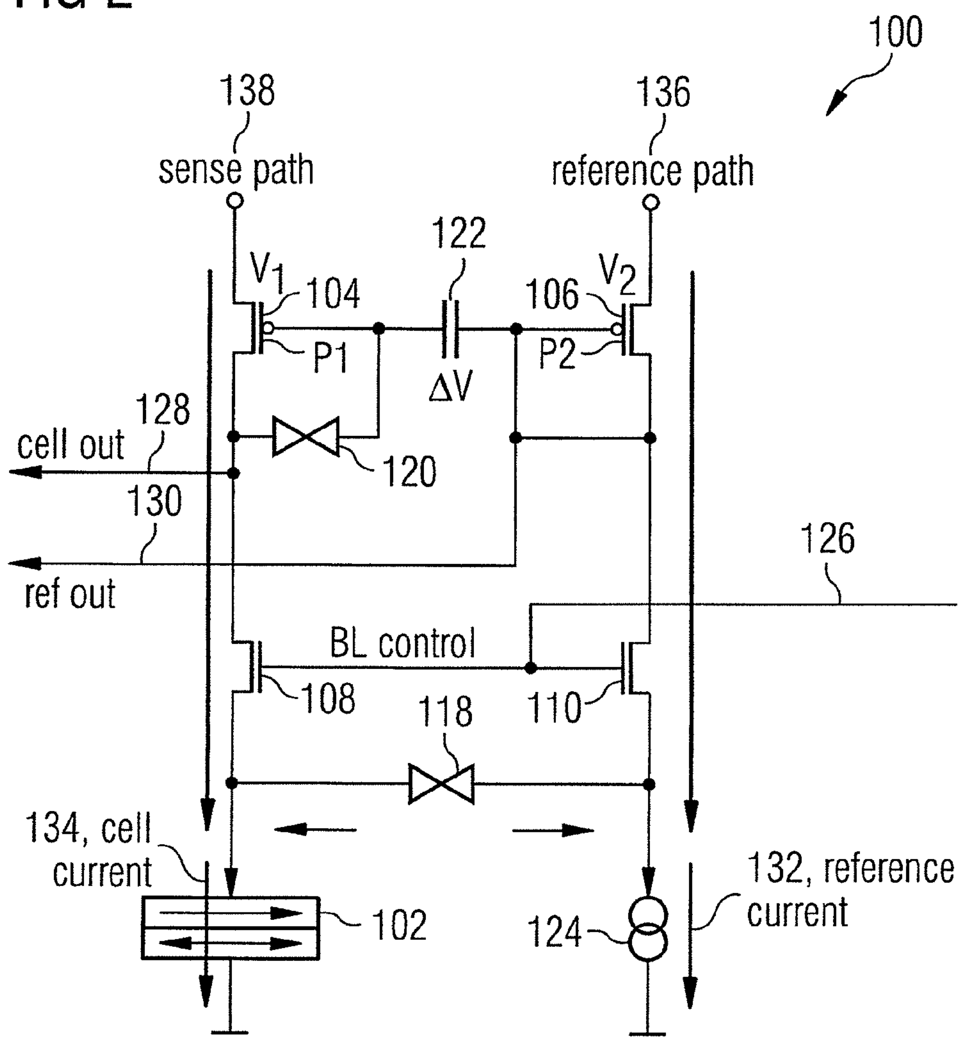
FIG. 2 is an example schematic diagram of a sensing system for a magnetic memory cell in accordance with one embodiment of the present invention.

FIG. 2 is an example schematic diagram of a system 100 for sensing a magnetic memory cell in accordance with one embodiment of the present invention. FIG. 2 illustrates the present invention during a precharge phase of the sensing system 100. The system 100 comprises a magnetic memory cell 102 such as a Spin Transfer Torque Magnetoresistive Random Access Memory (STT MRAM) cell which is to be sensed or read by the system 100. Although the present invention will be described with respect to an STT MRAM cell, one skilled in the art will realize that the present invention is not limited to STT MRAM cells but may be applied to any appropriate memory structure with a current sensing scheme which has only a small read window such as multilevel cell, phase change RAM (PCRAM), and conductive bridging RAM (CBRAM).

The system 100 further includes a plurality of transistors, 104, 106, 108 and 110, a first switch 118, a second switch 120, capacitance 122, a reference current source 124, a bit line control voltage 126, a cell output 128, and a reference output 130. The transistors 104 and 106 may be PMOS transistors, while transistors 108 and 110 may be NMOS transistors. One skilled in the art will realize that the present invention is not limited to the sensing or reading of a single memory cell, but that the invention may be used to read an array of magnetic memory cells and that the following description referring to one memory cell is for the purpose of simplification only.

The system 100 of the present invention overcomes the mismatch problem of the current mirror by storing the current mismatch on the capacitor 122 between the gates of the current mirror transistors during a precharge phase. In one embodiment of the present invention, the reference current and the cell current are averaged before the two transistors 108, 110 controlling the bitline voltage such that the same averaged current is flowing through both current mirror transistors 104 and 106 during a precharge phase. In one embodiment, the averaging of the two currents may be accomplished by enabling switch 118. Thus, during the precharge phase, the reference current 132 flows through the reference path 136 and switch 118, and the cell current 134 flows through the sense path 138 and the switch 118. When the switch 120 is enabled, the current mirror transistors 104 and 106 are both diode connected transistors, and their gate voltage will attain an individual voltage level V1 and V2 due to the threshold voltage mismatch of the transistors in the read/sense and reference paths. The difference between these two voltages is then stored on the capacitance 122 between transistors 104 and 106.

Figure 3:
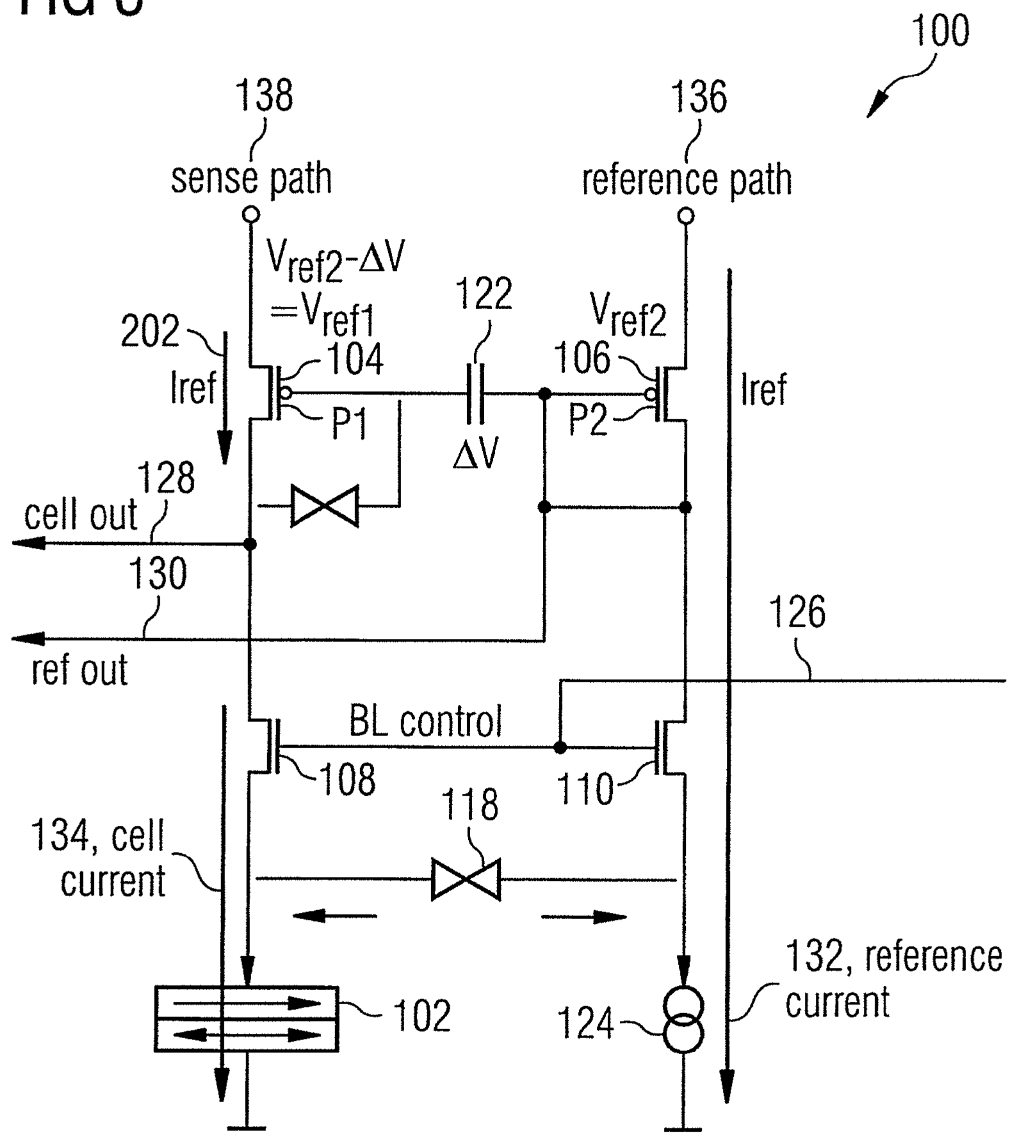
FIG. 3 is an example schematic diagram of a sensing system for a magnetic memory cell in accordance with one embodiment of the present invention.

FIG. 3 is an example schematic diagram of a system 100 for sensing or reading a magnetic memory cell in accordance with one embodiment of the present invention. FIG. 3 illustrates the present invention during the sensing phase of the sensing system 100. In accordance with one embodiment of the operation of the system 100, both switches 118 and 120 are opened and only the reference current 132 flows through the second mirror transistor 106. As a result of storing the mismatch voltage on the capacitance 122 during the precharge phase, as described above with respect to FIG. 2, the gate voltage of the first mirror transistor 104 is not equal to that of transistor 106 but is shifted by the previously stored voltage threshold difference. Thus, the mirrored reference current, Iref 202, which flows through transistor 104 is now independent of the current mirror mismatch. Thus, the present invention advantageously improves the accuracy of the read window with a negligible speed penalty and requires significantly smaller transistors for the current mirror.

FIG. 4 is a flowchart showing an example sensing method for reading a memory cell, such as an STT MRAM, in accordance with one embodiment of the present invention. For clarity, the method 400 for sensing a magnetic memory cell is described in context of the system 100 described in FIGS. 2 and 3. However, in alternate embodiments, other configurations may be used. Moreover, other embodiments may perform the actions described here in different orders and/or other embodiments may perform additional and/or different actions than those described here.

During a precharge phase, a cell current from the memory cell and a reference current from a reference source are averaged at 402 before flowing through the bitline and current mirror transistors. This averaging of the cell current and the reference current results in the same average current flowing through both the first and second current mirror transistors. The current mismatch is then stored on a capacitor connected between the gates of the first mirror transistor and the second mirror transistor in the current mirror at 404. During a sensing phase, the switches 118 and 120 are opened at 406, and only the reference current flows through the reference path and the second mirror transistor while only the cell current flows through the sense path and the first mirror transistor. As a result of the current averaging during the precharge phase, the gate voltage of the first mirror transistor (V1) is shifted by the voltage difference between the gates of the first and second mirror transistors previously stored on the capacitor. Thus, the current through the first mirror transistor during the sensing phase is independent of the mismatch of the current mirror. The output level of the sensing system is then determined by converting the current difference to a voltage difference.

One skilled in the art will realize that the present invention is not limited to sensing or reading STT MRAM cells as described above but that the present invention may also be used for other memories that employ a current sensing scheme and have a small read window. For example, the present invention may also be used with multilevel cells, phase change RAM (PCRAM), conductive bridging RAM (CBRAM), etc. The advantage of the present invention is the elimination of the error introduced by the current mirror mismatch.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for reducing mismatch error for a sense amplifier for memory cells, comprising:

during a precharge phase, averaging a cell current from a memory cell and a reference current from a reference source and flowing the averaged current through a first mirror transistor and a second mirror transistor of the sense amplifier;

during the precharge phase, storing a current mismatch between a sense path and a reference path of the sense amplifier on a capacitor between gate terminals of a first mirror transistor and a second mirror transistor that reside in the sense path and the reference path, respectively; and during a sensing phase, conducting only the cell current through the first mirror transistor in the sense path and solely the reference current through the second mirror transistor in the reference path.

2. The method of claim 1, wherein the first mirror transistor and the second mirror transistor are diode connected transistors

3. The method of claim 1, wherein a difference between a gate voltage of the first mirror transistor and a gate voltage of the second mirror transistor is stored on the capacitor between the gates of the first and second mirror transistors and reflects the current mismatch.

4. The method of claim 1, wherein averaging the cell current and the reference current is done before flowing through a first bitline transistor in the sense path and a second bitline transistor in the reference path, respectively.

5. The method of claim 1, wherein averaging the cell current from the memory cell and the reference current from the reference source is used during the precharge phase to measure and store the current mismatch between the sense and the reference paths.

6. The method of claim 1, wherein only the reference current flows through the second mirror transistor during the sensing phase.

7. The method of claim 1, wherein a gate voltage of the first mirror transistor is shifted by a voltage difference between gates of the first and second mirror transistors previously stored on the capacitor during the sensing phase.

8. The method of claim 1, wherein the current mismatch is canceled out during the precharge phase.

9. The method of claim 1, wherein the memory cell is an STT MRAM cell.

10. A system for sensing a memory cell, comprising:

a first mirror transistor in a sense path and a second mirror transistor in a reference path; and a capacitor coupled between gate terminals of the first mirror transistor and the second mirror transistor;

wherein during a precharge phase a current mismatch between the first mirror transistor and the second mirror transistor is stored on the capacitor, and a cell current of the memory cell in the sense path and a reference current in the reference path are averaged before flowing through the first and second mirror transistors.

11. The system of claim 10, wherein the current mismatch is stored on the capacitor as a voltage during the precharge phase.

12. The system of claim 10, wherein averaging the cell current and the reference current is used for the precharge phase to measure and store the current mismatch between the sense path and the reference path.

13. The system of claim 10, wherein a difference between a gate voltage of the first mirror transistor and a gate voltage of the second mirror transistor is stored on the capacitor and reflects the current mismatch during the precharge phase.

14. The system of claim 10, wherein only the reference current flows through the second mirror transistor during a sensing phase that follows the pre-charge phase.

15. The system of claim 10, wherein a gate voltage of the first mirror transistor during a sensing phase that follows the pre-charge phase is shifted by a differential voltage that represents the current mismatch stored on the capacitor.

16. The system of claim 10, wherein the current flowing through the first mirror transistor in the sense path during the sensing phase that follows the precharge phase is substantially equal to the reference current through the second mirror transistor in the reference path.

17. The system of claim 10, wherein the current mismatch is canceled out during the precharge phase.

18. The system of claim 10, wherein the memory cell is an STT MRAM cell.

19. A method for reducing mismatch error for a sense amplifier for memory cells, the method comprising:

providing an average current flowing through both a first mirror transistor in a sense path and a second mirror transistor in a reference path during a precharge phase;

storing a current mismatch between the sense path and the reference path on a capacitor coupled to gates of the first mirror transistor and the second mirror transistor; and providing a cell current through the first mirror transistor during a sensing phase that follows the precharge phase and a reference current flowing through the second mirror transistor.

20. The method of claim 19, wherein the first mirror transistor and the second mirror transistor are diode connected transistors.

21. The method of claim 19, wherein a difference between a gate voltage of the first mirror transistor and a gate voltage of the second mirror transistor is stored on the capacitor coupled between the gates of the first and second mirror transistors.

22. The method of claim 19, wherein providing an average current further comprises combining a cell current from a memory cell in the sense path and a reference current from a reference source in the reference path.

23. The method of claim 19, wherein combining the cell current and the reference current is done before providing a current through a first bitline transistor in the sense path and a second bitline transistor in the reference path.

24. The method of claim 19, wherein a gate voltage of the first mirror transistor is shifted in the sensing phase by a voltage difference between the gates of the first and second mirror transistors previously stored on the capacitor in the precharge phase.

25. The method of claim 19, wherein the current through the first mirror transistor during the sensing phase is independent of the current mismatch.

26. The method of claim 19, wherein the memory cell is an STT MRAM cell.

27. A system for sensing a memory cell, comprising:

a first mirror transistor in a sense path and a second mirror transistor in a reference path;

a capacitor coupled between gate terminal of the first mirror transistor and the second mirror transistor for storing a current mismatch between the first mirror transistor and the second mirror transistor in a precharge phase; and a reference source configured to provide a reference current, wherein a cell current from the memory cell and the reference current from the reference source are combined to provide an average current flowing through the first and second mirror transistors during the precharge phase and wherein the average current is used to measure and store the current mismatch between the sense and the reference paths on the capacitor; and wherein the current mismatch is canceled out during the precharge phase.

28. The system of claim 27, wherein the current mismatch is stored on the capacitor as a voltage during the precharge phase.

29. The system of claim 27, wherein a difference between a gate voltage of the first mirror transistor and a gate voltage of the second mirror transistor is stored on the capacitor in the precharge phase.

30. The system of claim 27, wherein only the reference current flows through the second mirror transistor during a sensing phase that follows the precharge phase.

31. The system of claim 27, wherein a gate voltage of the first mirror transistor during a sensing phase that follows the precharge phase is shifted by a differential voltage stored on the capacitor that reflects the current mismatch.

32. The system of claim 27, wherein the current flowing through the first mirror transistor is independent of the current mirror mismatch in the sensing phase.

33. The system of claim 27, wherein the memory cell is an STT MRAM cell.

* * * * *